(12) United States Patent
Teter

(10) Patent No.: US 6,737,776 B1
(45) Date of Patent: May 18, 2004

(54) HYBRID LINEAR MOTOR

(75) Inventor: Joseph P. Teter, Mt. Airy, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/400,507

(22) Filed: Mar. 28, 2003

(51) Int. Cl.[7] .................................................. H02K 7/10
(52) U.S. Cl. ............................... 310/78; 310/76; 310/92
(58) Field of Search ............................. 310/78, 76, 80, 310/92, 100, 102 A

(56) References Cited

U.S. PATENT DOCUMENTS

| | | | | |
|---|---|---|---|---|
| 3,326,342 A | * | 6/1967 | Hack | 192/45.1 |
| 5,039,894 A | * | 8/1991 | Teter et al. | 310/26 |
| 5,041,753 A | * | 8/1991 | Clark et al. | 310/328 |
| 5,079,460 A | * | 1/1992 | Vranish | 310/26 |
| 5,341,056 A | * | 8/1994 | Maccabee | 310/26 |
| 5,438,422 A | * | 8/1995 | Holowko et al. | 358/3.29 |
| 5,451,821 A | | 9/1995 | Teter et al. | |
| 5,530,312 A | | 6/1996 | Teter et al. | |
| 5,705,863 A | * | 1/1998 | Teter | 310/26 |
| 6,410,999 B1 | | 6/2002 | Vranish et al. | |

* cited by examiner

Primary Examiner—Thanh Lam
(74) Attorney, Agent, or Firm—Jacob Shuster

(57) ABSTRACT

A magnetostrictive motor is provided with a pair of clutch devices on a rotor shaft through which electrical energy from electromagnetic rings on a tubular reactor is converted into forces transferred to the rotor shaft within the reactor under selective control of magnetostrictors and clutches within the tubular reactor to either accelerate or decelerate motion imparted by such forces to the rotor shaft for change of rotor speed magnitude and direction.

10 Claims, 2 Drawing Sheets

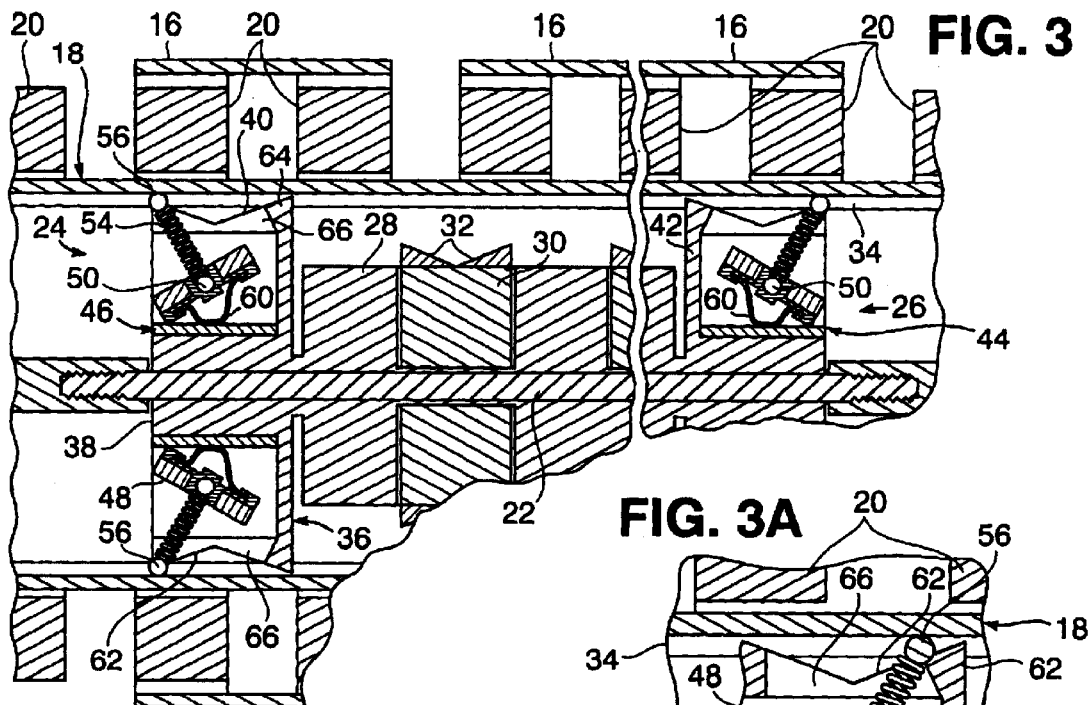
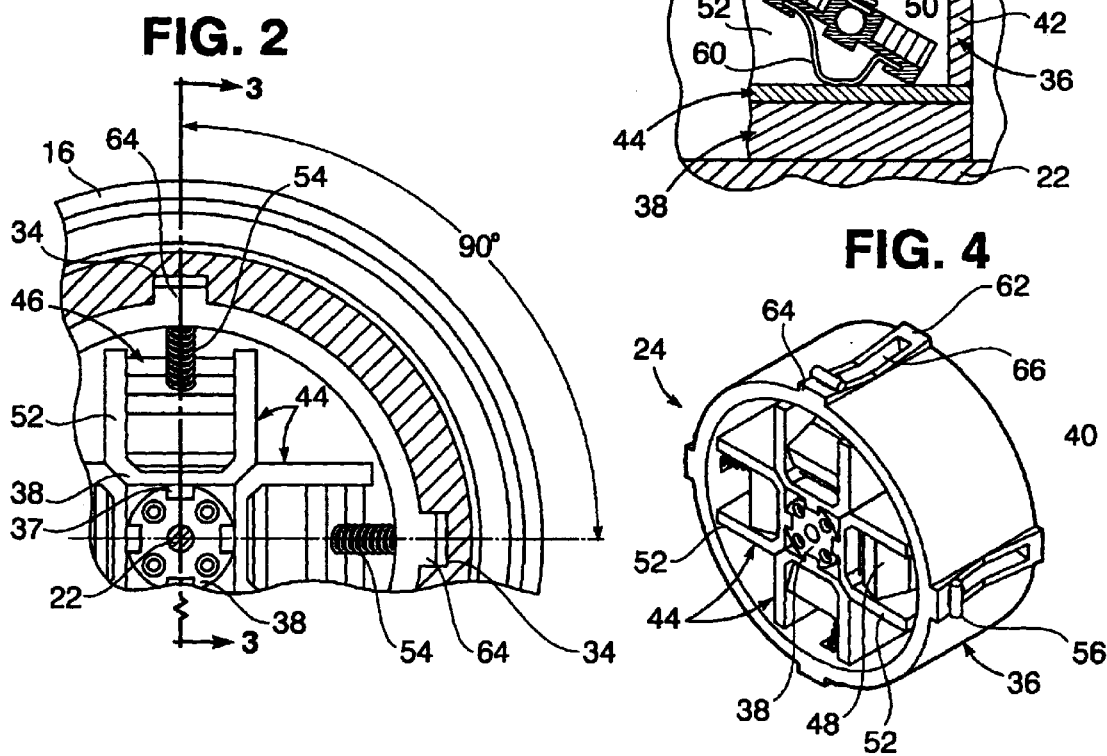

HYBRID LINEAR MOTOR

The present invention relates generally to electromagnetic driven motors involving coacting rotor and stator drive arrangements to achieve smooth and high power linear motion, utilizing electromagnetic coil rings, permanent magnets and solid state elements.

BACKGROUND OF THE INVENTION

High-power, solid-state motors of a magnetostrictive type are already well known as disclosed for example in U.S. Pat. Nos. 5,039,894, 5,530,312 and 5,705,863. Directional and magnitude control of magnetic fields associated with magnetostrictive motors is also known as disclosed for example in U.S. Pat. No. 5,451,821. Conversion of electromagnetic energy into directionally controlled rotational motion is also generally known, as disclosed in U.S. Pat. Nos. 5,041,753, 5,079,460 and 6,410,999.

SUMMARY OF THE INVENTION

In accordance with the present invention, radially inner and outer magnetic stator coil rings are electrically energized on a reactor tube within which a rotor shaft axially extends with permanent biasing magnets positioned thereon axially spaced from each other by magnetostrictive supports on which stator magnet rings are positioned within the reactor tube underlying the magnetic stator rings.

Also positioned on the rotor shaft within the reactor tube are a pair of clutch devices adjacent opposite axial ends of the rotor shaft. Such clutch devices are selectively controlled to convert electromagnetic energy into mechanical forces under spring and magnetic bias applying linear motion to the rotor shaft under load. By selective directional control of such clutch devices, the motion may be varied by acceleration to a high speed or deceleration and immobilization of the rotor shaft.

Power supply for the various stator and rotor components of the electromagnetic motor arranged pursuant to the present invention provides for selection of different operational modes to accommodate different load and speed requirements.

BRIEF DESCRIPTION OF DRAWING

A more complete appreciation of the invention and many of its attendant advantages will be readily appreciated as the same becomes better understood by reference to the following detailed description when considered in connection with the accompanying drawing wherein:

FIG. 2 is an enlarged partial section view taken substantially through a plane indicated by section line 2—2 in FIG. 1;

FIG. 3 is an enlarged partial section view of the motor taken substantially through a plane indicated by section line 3—3 in FIG. 2;

FIG. 3A is a partial section view corresponding to a portion of FIG. 3, wherein the motor is in another operational condition;

FIG. 4 is a perspective view of one of the two clutch devices embodied in the motor illustrated in FIG. 3.

DETAILED DESCRIPTION OF PREFERRED EMBODIMENT

Figure 1:
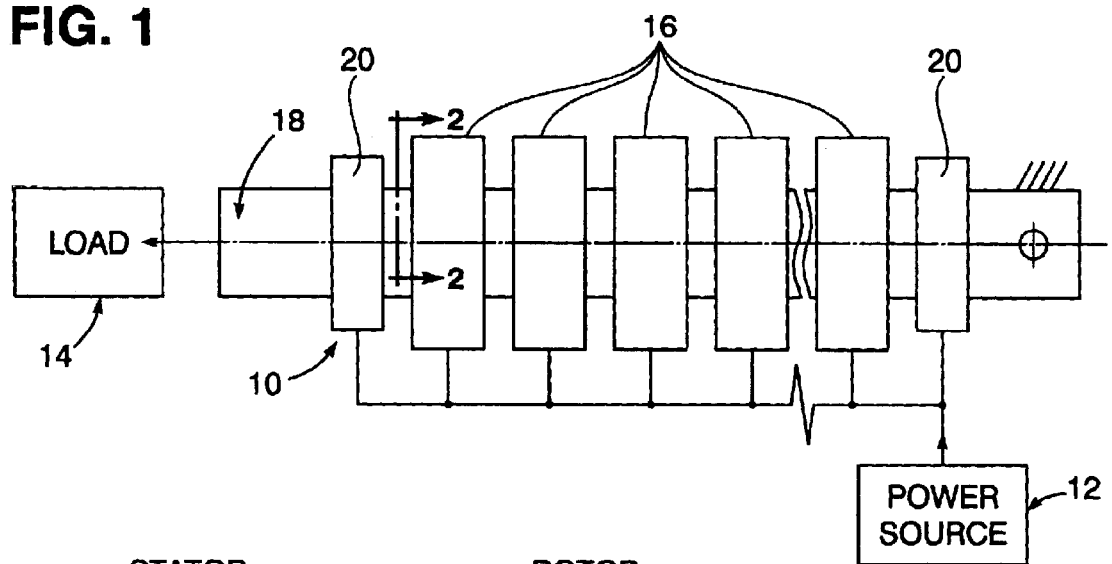
FIG. 1 is a side elevation view of a magnetostrictive type of motor constructed in accordance with one embodiment of the present invention.

Referring now to the drawing in detail, a linear hybrid type of magnetostrictive motor 10 is illustrated, to which oscillating electrical energy is supplied from a power source 12 so to impart movement to some load 14 as diagrammed in FIG. 1. As also shown in FIG. 1, the power source 12 supplies oscillating electrical energy to a plurality of magnetic coil rings 16 which are coaxially positioned about a stator reactor tube 18. Each ring 16 is disposed in surrounding relation to a pair of inner magnetic coil rings 20, also positioned on the reactor tube 18 in axially spaced relation to each other as shown in FIG. 3. One of such inner magnetic coil rings 20 is also exposed on the reactor tube 18 adjacent to each of the opposite axial ends thereof as shown in FIG. 1. The electrical energy is supplied to all of the magnetic rings 16 and 20 for motor operation as hereinafter explained.

With continued reference to FIG. 3, a rod or rotor shaft 22 extends axially through the stator reactor tube 18. A pair of rotor clutch devices 24 and 26 are respectively positioned on the rotor shaft 22 adjacent opposite axial ends thereof within the reactor tube 18, underlying outer magnetic stator ring 16 and pairs of the inner magnetic stator rings 20. Each of such clutch devices 24 and 26 is controllably engagable with the reactor tube 18 to convert oscillating electrical energy into linear motion of the rotor shaft 22 as hereinafter explained.

Also fixedly positioned on the rotor shaft 22 between the clutch devices 24 and 26 within the reactor tube 18 are solid state smart material elements including a plurality biasing magnets 28 and magnetostrictors 30. The solid state smart material of such elements includes magnetic shaped memory alloys which change shape when subject to a magnetic field as generally known in the art. The biasing magnet elements 28 are axially spaced from each other by the magnetostrictors 30 on which stator magnets 32 are positioned underlying the cylindrical inner surface of the reactor tube 18, which is provided with four axially extending grooves 34 angularly spaced from each other by 90° as shown in FIG. 2.

Referring now to FIGS. 2, 3 and 4, each of the clutch devices 24 and 26 includes a housing 36 having a radially inner annular portion 38 positioned on the rotor shaft 22. A radially outer annular portion 40 of each of the clutch housings 36 has an end wall portion 42. Four clutch shells 44 are respectively fixedly positioned within each of the clutch housings 36 by projections extending into recesses formed therein as shown in FIGS. 2 and 4. Within each of the clutch shells 44, a toggle base holder 46 is disposed. Each of such toggle base holders 46 has a pair of permanent magnets 48 positioned thereon on opposite sides of a pivot pin 50 extending through the holder 46 into the side walls 52 of the clutch shell 44 so as to pivotally mount the holder 46 for angular displacement within the clutch shell 44 between opposite angular positions as respectively shown in FIGS. 3 and 3A. Connected to each of the pivot pins 50 is an axial end of a coil spring 54. The other axial end of each coil spring 54 has a clutch pin 56 connected thereto as shown in FIG. 3. Each of such clutch pins 56 will accordingly be displaced between positions as respectively shown in FIGS. 3 and 3A, held in engagement with the reaction tube 18 within one of the slots 34 so as to exert force through its spring 54 and pivot pin 50. The clutch pins 56 are yieldably held in such spaced positions within the clutch housing 36 by engagement holding springs 60 fixed to the pivoted holder 46 and in biased contact with the bottom of its clutch shell 44 as shown in FIGS. 3 and 3A. The clutch pins 56 are furthermore confined to movement between their positions along angled paths through the slot 66 in projections 64 extending radially from the outer annular clutch housing portions 40 as shown in FIGS. 3, 3A and 4. The springs 54 are connected to the clutch pins 56 by extending thereto through the slots 66 in the housing projections 64. The physical pressures of the clutch pin connecting springs 54 and the holding springs 60, together with forces exerted by the permanent magnets 48 carried on the holder 46, will accordingly insure transmittal of linear motion inducing forces to the rotor shaft 22 through the clutch devices 24 and 26.

Figure 5:
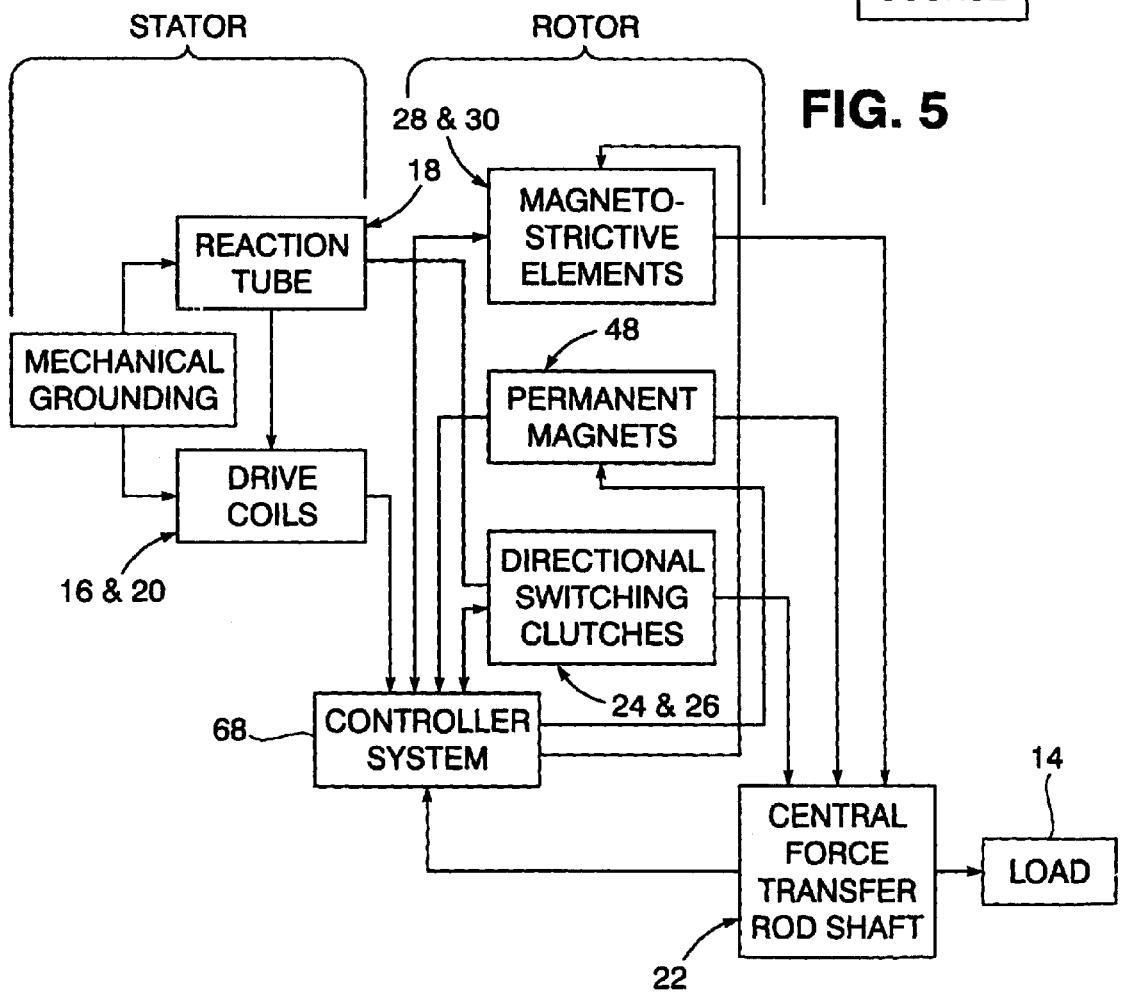
FIG. 5 is a diagram of the motor illustrated in FIGS. 1–4, in association with its controller system.

It will be apparent from the foregoing description that forces may be controllably transferred to the load 14 through the rod shaft 22 in accordance with three operational modes of the motor 10. Such forces are exerted through the clutch devices 24 and 26, involving the permanent magnets 28 and 30 as part of a rotor arrangement in response to electromagnetic energy supplied thereto under selective control of a controller system 68 as diagrammed in FIG. 5. The electromagnetic energy is derived from the magnetic drive coil rings 16 and 20, and the reaction tube 18 forming part of the motor stator.

By means of the controller system 68, the two clutch devices 24 and 26 may be selectively conditioned as shown in FIG. 3, so as to respectively effect transmittal of motion inducing intermittent forces in the same angular direction during one operational mode to cause acceleration of the rotor shaft 22 to a selectively high speed. In such operational mode, the magnetic field generated by the stator drive coil rings 16 and 20 acts with attraction or repulsion of their magnetic fields induced by the permanent rotor magnets 28 and 30. Such magnetic interaction impart directional movements to the rotor shaft 22 relative to the reaction tube 18, as already known in the art of electromagnetic linear motors. By use of the one-way clutch devices 24 and 26 in the arrangement of the present invention as hereinbefore described, retractive motion of the rotor shaft 22 is prevented when power is removed from the stator drive coils 16 and 20. Through the controller system 68, the directionality of clutch operation may be switched by application of a magnetic control field of the biasing magnets 28 and the magnetostrictors 30.

Under another operational mode, the magnetostrictors 30 provide the motive power. In such second operational mode, the magnetic control field generated by the biasing magnets 28 acts to change the internal state of the magnetostrictive material of the rotor shaft 22 to effect a relatively small change in its length. The motion associated with such change in shaft length, in conjunction with operation of the one-way clutches 24 and 26, acts to incrementally displace the rotor assembly relative to the reactor tube 18 in accordance with selective directional switching of the one-way clutches pursuant to the present invention, by said application of the magnetic control field of the biasing magnets 28.

By using the system controller 68 to command sequential energization of the biasing magnets 28 and magnetostrictors 30, a third hybrid mode of operation is achieved involving use of both of the aforementioned operational modes. Thus, when the output force exerted on the rotor rod shaft 22 during the first operational mode is sensed in the controller system 68 to be lower than a critical force level (Fc), the hybrid operational mode is instituted to induce use of the second operational mode to thereby obtain a higher rotor speed. When the output force is sensed to be above the critical force level (Fc), the electromagnetic interaction will continue to enlarge the output force magnetically generated.

Thus, the present invention as hereinbefore described advantageously enables use of electromagnetic interaction to impart rotor motion independently of magnetostrictive interaction so as to provide a higher force output when the force level is below (Fc). When the output force requirements are low, such operational mode will advantageously provide high speed and low power consumption. The controller system 68 may also selectively condition the clutch devices 24 and 26 as shown in FIG. 3A to transmit motion inducing forces in opposite directions as hereinbefore described in order to effect motion deceleration and immobilize the rotor shaft 22. Also under control of such controller system 68 the duration of acceleration and deceleration intervals may be varied in order to achieve a desired speed.

Obviously, other modifications and variations of the present invention may be possible in light of the foregoing teachings. It is therefore to be understood that within the scope of the appended claims the invention may be practiced otherwise than as specifically described.

What is claimed is:

1. In combination with an electromagnetic motor having a pair of clutch devices through which motion is imparted to a shaft under load; a method for controlling said motion imparted to the shaft through the clutch devices, including the steps of: transferring forces through the clutch devices to the shaft for respective acceleration and deceleration of the motion being imparted to the shaft; and selecting relative directions in which said acceleration and deceleration are effected to directionally control variation in the motion being imparted to the shaft.

2. The combination as defined in claim 1, wherein said transferring of forces through the clutch devices are effected during intervals of selectively varied duration.

3. The combination as defined in claim 2, wherein said motion imparted to the shaft is in opposite directions about an axis along which the clutch devices are spaced from each other on the shaft.

4. The combination as defined in claim 1, wherein said motion imparted to the shaft is in opposite directions about an axis along which the clutch devices are spaced from each other on the shaft.

5. In combination with an electromagnetic motor having a tubular reactor on which electrically energized magnetic coil rings are externally positioned and a rotor shaft on which solid state smart material elements are positioned inside of the tubular reactor, clutch means operatively positioned on the rotor shaft within the tubular reactor for conversion of electrical energy into forces transmitted to the rotor shaft; and control means for selecting direction in which said forces are transmitted through the clutch means to the rotor shaft to effect acceleration and deceleration of motion imparted to the rotor shaft by said forces.

6. The combination as defined in claim 5, wherein the clutch means comprises: a pair of clutch devices, each of said clutch devices including: a clutch housing positioned on the rotor shaft; permanent magnet holders pivotally mounted within the clutch housing at a plurality of angularly spaced positions about the rotor shaft; spring means yieldably retaining the holders in the angularly spaced positions within the clutch housing; and clutch pin means connected to the spring means and projecting from the clutch housing for biased force transferring engagement with the tubular reactor.

7. The combination as defined in claim 6, wherein said tubular reactor is internally formed with angularly spaced axial grooves within which the clutch pin means is received.

8. The combination as defined in claim 5, wherein the solid state smart material elements include: magnetostrictors and magnetic shape memory alloys.

9. A magnetostrictive motor including: a reactor tube through which a rotor shaft extends; magnetic drive means positioned on the reactor tube for generating linear drive forces in response to electrical energy; magnetostrictor means positioned within the reactor tube and responsive to the electrical energy for magnetostrictive regulation; clutch means positioned within the reactor tube for transferring said linear drive forces to the rotor shaft; and controller means for selectively supplying the electrical energy to the magnetic drive means, the magnetostrictor means and the clutch means for selective operation of the motor under different operational modes and directions of the linear drive forces transferred by the clutch means to the rotor shaft.

10. The magrietostrictive motor as defined in claim 9, wherein said different operational modes include: a first mode during which the linear drive forces are exclusively imparted to the rotor shaft without said magnetostrictive regulation; a second mode during which both said linear forces and said magnetostrictive regulation are imparted; and a hybrid mode under which the first and second modes are alternatively established.

* * * * *